US012760248B2

(12) United States Patent
Kim et al.

(10) Patent No.: US 12,760,248 B2
(45) Date of Patent: Oct. 13, 2026

(54) CLEANING AGENT COMPOSITION FOR SUBSTRATE FOR SEMICONDUCTOR DEVICES AND METHOD FOR CLEANING SUBSTRATE FOR SEMICONDUCTOR DEVICES USING THE SAME

(71) Applicants: ENF TECHNOLOGY CO., LTD., Yongin-si (KR); SK hynix Inc., Icheon-si (KR)

(72) Inventors: Hye Ji Kim, Yongin-si (KR); JinHo You, Yongin-si (KR); Hag Sung Lee, Yongin-si (KR); Myungho Lee, Yongin-si (KR); Narae Yim, Icheon-si (KR); Yu Jin Heo, Icheon-si (KR); Keon Young Kim, Icheon-si (KR); Yun Sun Choi, Icheon-si (KR); Young Mee Kang, Icheon-si (KR)

(73) Assignees: ENF TECHNOLOGY CO., LTD., Yongin-si (KR); SK HYNIX INC., Icheon-si (KR)

( * ) Notice: Subject to any disclaimer, the term of this patent is extended or adjusted under 35 U.S.C. 154(b) by 169 days.

(21) Appl. No.: 18/487,868

(22) Filed: Oct. 16, 2023

(65) Prior Publication Data

US 2024/0150681 A1 May 9, 2024

(30) Foreign Application Priority Data

Oct. 24, 2022 (KR) ........................ 10-2022-0137664

(51) Int. Cl.
*C11D 3/26* (2006.01)
*C11D 1/00* (2006.01)
(Continued)

(52) U.S. Cl.
CPC ............ *C11D 7/3209* (2013.01); *C11D 1/004* (2013.01); *C11D 3/162* (2013.01); *C11D 3/2072* (2013.01);
(Continued)

(58) Field of Classification Search
CPC ..... C11D 3/162; C11D 3/2072; C11D 3/2093; C11D 3/30; C11D 3/32
(Continued)

(56) References Cited

U.S. PATENT DOCUMENTS 6,566,319 B1 5/2003 Scheibel et al.
7,776,755 B2 * 8/2010 Lin .................. H01L 21/31111 438/759
(Continued)

FOREIGN PATENT DOCUMENTS

CN 1270623 A 10/2000
CN 101048857 A 10/2007
(Continued)

OTHER PUBLICATIONS

Ministry of Intellectual Property, South Korea, Notice of Allowance Issued in Application No. 10-2022-0137664, May 11, 2026, 6 pages. (Submitted with Machine Translation).
(Continued)

*Primary Examiner* — Gregory R Delcotto
(74) *Attorney, Agent, or Firm* — McCoy Russell LLP

(57) ABSTRACT

The present disclosure relates to a cleaning agent composition for a substrate for a semiconductor device and a method for cleaning a substrate for a semiconductor device using the same. The cleaning agent composition contains a silicon-based compound represented by Formula 1 and an aprotic organic solvent with a dielectric constant of 10 or less, which can form a surface protective film capable of preventing collapse of the pattern even in a wet cleaning process of fine
(Continued)

patterns with high aspect ratios, thereby providing a method for manufacturing a semiconductor device with an improved semiconductor manufacturing yield.

14 Claims, 1 Drawing Sheet

(51) Int. Cl.

| | |
|---|---|
| ***C11D 3/16*** | (2006.01) |
| ***C11D 3/20*** | (2006.01) |
| ***C11D 3/28*** | (2006.01) |
| ***C11D 3/30*** | (2006.01) |
| ***C11D 3/32*** | (2006.01) |
| ***C11D 7/26*** | (2006.01) |
| ***C11D 7/28*** | (2006.01) |
| ***C11D 7/32*** | (2006.01) |
| ***C11D 7/50*** | (2006.01) |
| ***H10P 70/00*** | (2026.01) |

(52) U.S. Cl.
CPC .............. *C11D 3/2093* (2013.01); *C11D 3/30* (2013.01); *C11D 3/32* (2013.01); *C11D 7/265* (2013.01); *C11D 7/28* (2013.01); *C11D 7/3281* (2013.01); *C11D 7/5022* (2013.01); *H10P 70/20* (2026.01); *C11D 2111/22* (2024.01)

(58) Field of Classification Search
USPC ................ 510/175, 186, 466, 500, 505, 506
See application file for complete search history.

(56) References Cited

U.S. PATENT DOCUMENTS

| | | | | |
|---|---|---|---|---|
| 2006/0180573 | A1 * | 8/2006 | Hansen | C11D 7/08 216/84 |
| 2017/0330762 | A1 * | 11/2017 | Kamei | H01L 21/3212 |
| 2019/0185793 | A1 * | 6/2019 | Toshima | C11D 7/32 |
| 2020/0035494 | A1 | 1/2020 | Wojtczak et al. | |
| 2022/0135915 | A1 | 5/2022 | Her et al. | |

FOREIGN PATENT DOCUMENTS

| | | | | | |
|---|---|---|---|---|---|
| CN | 111630639 | A | | 9/2020 | |
| CN | 114437882 | A | | 5/2022 | |
| JP | 2000019744 | A | | 1/2000 | |
| KR | 101075200 | B1 | | 10/2011 | |
| KR | 20170126782 | A | | 11/2017 | |
| KR | 20170134899 | A | | 12/2017 | |
| KR | 20180075416 | A | | 7/2018 | |
| KR | 20190038459 | A | | 4/2019 | |
| KR | 20190098053 | A | | 8/2019 | |
| KR | 20210041584 | A | | 4/2021 | |
| WO | WO-2008149325 | A1 | * | 12/2008 | C23C 16/4407 |
| WO | WO-2017220479 | A1 | * | 12/2017 | G03F 7/40 |
| WO | WO-2018095885 | A1 | * | 5/2018 | G03F 7/40 |

OTHER PUBLICATIONS

State Intellectual Property Office of the People's Republic of China, Office Action and Search Report Issued in Application No. 202311372527.2, Aug. 4, 2026, 11 pages. (Submitted with Partial Translation).

* cited by examiner

CLEANING AGENT COMPOSITION FOR SUBSTRATE FOR SEMICONDUCTOR DEVICES AND METHOD FOR CLEANING SUBSTRATE FOR SEMICONDUCTOR DEVICES USING THE SAME

CROSS-REFERENCE TO RELATED APPLICATION

This application claims priority under 35 U.S.C. § 119 to Korean Patent Application No. 10-2022-0137664, filed on Oct. 24, 2022, in the Korean Intellectual Property Office, the disclosure of which is incorporated herein by reference in its entirety.

TECHNICAL FIELD

The following disclosure relates to a cleaning agent composition for a substrate for a semiconductor device and a method for cleaning a substrate for a semiconductor device using the same.

BACKGROUND

Semiconductor devices are manufactured through various processes, including photolithography processes that form circuit patterns on substrates such as silicon wafers. During this manufacturing process, various foreign substances such as particles, organic contaminants, and metal impurities are generated. These foreign substances cause defects in a substrate and thus serve as a factor that directly affects a yield of semiconductor devices. Therefore, a semiconductor manufacturing process necessarily involves a cleaning process to remove these foreign substances.

In particular, as semiconductor devices become more highly integrated, patterns with high aspect ratios in a DPT (double patterning technology) or QPT (quadruple patterning technology) process used produces. These patterns collapse due to a surface tension of a chemical solution when dried after a wet cleaning process, or bridge defects where adjacent patterns are connected frequently occur.

Therefore, in order to prevent such defects, a drying process using a supercritical fluid has been widely used. The supercritical fluid has characteristics of both a liquid and a gas, and may be used in the drying process because it has high diffusivity like a gas, but is not affected by the surface tension and may be used as a solvent like a liquid.

However, the supercritical fluid flowing under high pressure conditions may damage the substrate or collapse fine patterns themselves due to high pressure, and may cause problems that may be provided as a particle source due to adiabatic expansion when accompanied by rapid pressure changes. In addition, since a flow of the supercritical fluid is stable, an efficiency of removing the chemical solution is not sufficient, which increases processing time and processing costs.

Meanwhile, surface treatments other than the drying process are also used to reduce the surface tension of fine patterns to prevent pattern collapse. Materials used to form fine patterns are $SiO_2$, SiN, SiOC, poly-Si, etc., and Si additives are used to form a water-repellent protective film to minimize pattern collapse.

However, existing additives have the disadvantage that the water-repellent effect on a SiN surface is lower than that of a $SiO_2$ film. Therefore, it is necessary to develop additives with an excellent water-repellent effect on the SiN surface by compensating for these shortcomings.

SUMMARY

An embodiment of the present disclosure is directed to providing a cleaning agent composition for a substrate for a semiconductor device that may prevent the pattern from collapsing even after a wet cleaning process by reducing surface energy of fine patterns through surface treatment.

Another embodiment of the present disclosure is directed to providing a method for manufacturing a semiconductor device that improves yield of manufacturing a semiconductor device by significantly increasing a water-repellent effect on a surface of a silicon-based substrate.

In one general aspect, there is provided a cleaning agent composition for a substrate for a semiconductor device, containing a compound represented by the following Formula 1 and an organic solvent, wherein the organic solvent is an aprotic organic solvent with a dielectric constant of 10 or less:

[Formula 1]

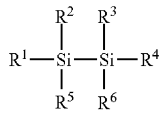

wherein $R^1$ to $R^4$ are independently selected from hydrogen, a halogen group, a hydroxy group, a C1-C8 alkyl group, a C1-C8 alkyl group substituted with a halogen group, a C1-C8 alkyl group substituted with a hydroxy group, cycloalkyl, and heterocycloalkyl; $R^5$ and $R^6$ are independently selected from hydrogen, a halogen group, a hydroxy group, —$NO_2$, —NR'R", —$N_2$, a C1-C8 alkyl group, a C1-C8 alkyl group substituted with a halogen group, and a C1-C8 alkyl group substituted with a hydroxy group; and R' and R" are independently selected from hydrogen and a C1-C4 alkyl group, or R' and R" may be connected to each other to form a 5- to 7-membered ring.

In Formula 1, $R_1$ to $R^4$ are independently selected from hydrogen, a halogen group, a C1-C4 alkyl group, a C1-C4 alkyl group substituted with a halogen group, cycloalkyl, and heterocycloalkyl; $R^5$ and $R^6$ are independently selected from —$NO_2$, —$NH_2$, —NHR', —NR'R", —$N_2$, and a C1-C4 alkyl group; and R' and R" are the same or different C1-C4 alkyl groups, or R' and R" may be connected to each other to form a 5- to 7-membered ring.

In Formula 1, $R^1$ to $R^4$ may be independently selected from a C1-C4 alkyl group, a C1-C4 alkyl group substituted with a halogen group, cycloalkyl, and heterocycloalkyl; and $R^5$ and $R^6$ may be independently selected from hydrogen and a halogen group.

In Formula 1, $R^1$ to $R^4$ are a C1-C4 alkyl group, $R^5$ and $R^6$ are independently selected from —$NO_2$, —NHR', —NR'R", and a C1-C4 alkyl group, and at least one of $R^5$ and $R^6$ are selected from —$NO_2$, —NHR', and —NR'R"; and R' and R" are a methyl group, or R' and R" may be connected to each other to form a 5-membered ring.

In Formula 1, $R^1$ to $R^4$ are a C1-C4 alkyl group; and $R^5$ and $R^6$ may be the same or different halogen groups.

The compound represented by Formula 1 may be selected from the structures below:

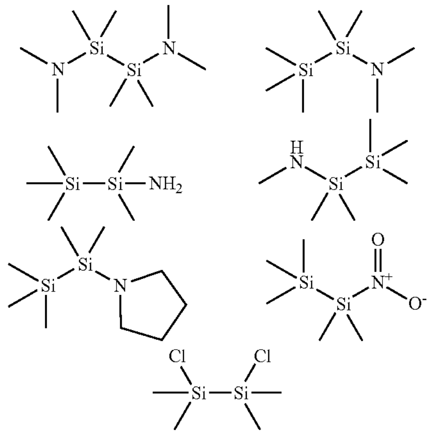

The organic solvent may be a C5-C10 aliphatic alkane-based solvent or an acetate-based solvent with a dielectric constant of 9 or less.

The acetate-based solvent may be represented by the following Formula 2:

[Formula 2]

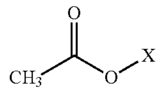

wherein X is a straight or branched chain C1-C6 alkyl group, and $-CH_2-$ of the alkyl may be substituted with an oxygen atom.

The composition may contain 1 to 10% by weight of the compound represented by Formula 1, and the balance organic solvent based on the total weight of the composition.

The composition may further contain at least one of a reaction accelerator and a surfactant.

The composition may contain 1 to 10% by weight of the compound represented by Formula 1, 0.1 to 10% by weight of a reaction accelerator, and the balance organic solvent based on the total weight of the composition.

The reaction accelerator may be an acid catalyst selected from acetic acid, trifluoroacetic acid, and trifluoroboron, or a basic catalyst selected from methylamine, ethylamine, propylamine, diethylamine, triethylamine, dipropylamine, tripropylamine, ethanolamine, and triethanolamine.

In another general aspect, there is provided a method for cleaning a substrate for a semiconductor device including: a cleaning step of bringing the cleaning agent composition for a substrate for a semiconductor device as described above into contact with a surface of a substrate with a residue after etching.

A contact angle measured after the composition is brought into contact with a silicon nitride film for 60 seconds may be 60° or more.

In another general aspect, there is provided a method for manufacturing a semiconductor device including: the cleaning step of a substrate for a semiconductor device, as described above.

In another general aspect, there is provided a method for preparing a cleaning agent composition for a substrate for a semiconductor device including: mixing the compound represented by Formula 1 as described above and the organic solvent as described above with each other.

DETAILED DESCRIPTION OF EMBODIMENTS

Figure 1:
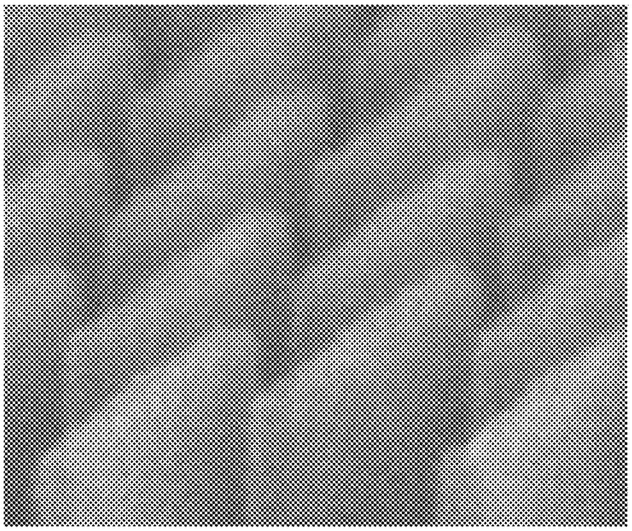
FIG. 1 illustrates an SEM image with a high aspect ratio pattern after cleaning a substrate according to an embodiment of the present disclosure.

Hereinafter, a cleaning agent composition for forming a surface protective film to prevent collapse of a fine pattern generated on a semiconductor substrate in a cleaning step after forming a fine pattern with a large aspect ratio during a semiconductor process and a method for cleaning a substrate for a semiconductor device using the same will be described in detail.

Technical terms and scientific terms used herein have the general meaning understood by those skilled in the art to which the present disclosure pertains, unless otherwise defined, and a description for the known function and configuration unnecessarily obscuring the gist of the present disclosure will be omitted in the following description.

Further, singular forms used in the specification are intended to include the plural forms as well unless otherwise indicated in context.

In addition, units used herein are based on weight, unless otherwise specified. For example, the unit of % or ratio means % by weight or ratio by weight, and % by weight means by weight of any one component in the total composition, unless otherwise defined.

In addition, numerical ranges used herein include a lower limit, an upper limit, and all values within that range, increments that are logically derived from the type and width of the defined range, all double-defined values, and all possible combinations of upper and lower limits of numerical ranges defined in different forms. Unless otherwise specifically defined herein, values outside the numerical range that may arise due to experimental errors or rounded values are also included in the defined numerical range.

As used herein, the term "comprise" is an open description having the meaning equivalent to expressions such as "include," "contain," "have," or "feature", and does not exclude elements, materials, or process that are not further listed.

In addition, as used herein, the term "substantially" means that any other element, material, or process not enumerated together with the specified element, material, or process may be present in an amount or degree that does not impermissibly and significantly affect at least one basic and novel technical idea of the present disclosure.

As used herein, the term "cleaning" may refer to a process of removing impure particles or various contaminants from a substrate by a chemical solution or a mixture of a chemical solution and DIW (deionized water) to the substrate.

As used herein, the term "residue" may be by-products generated after etching or ashing from substrates used in a semiconductor industry, and may refer to contamination particles or contamination layers comprising organic or inorganic materials that may be present on the substrate after said processes.

As used herein, substituents including alkyl, alkoxy, or alkyl may include both straight or branched chain forms.

As used herein, the term "halogen" may refer to a fluorine, chlorine, bromine, or iodine atom.

Hereinafter, a cleaning agent composition for a substrate for a semiconductor device according to the present disclosure will be described in detail.

The cleaning agent composition for a substrate for a semiconductor device according to the present disclosure may contain a compound represented by the following Formula 1 and an organic solvent:

[Formula 1]

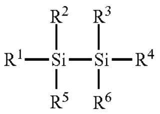

wherein $R^1$ to $R^4$ are independently selected from hydrogen, a halogen group, a hydroxy group, a C1-C8 alkyl group, a C1-C8 alkyl group substituted with a halogen group, a C1-C8 alkyl group substituted with a hydroxy group, cycloalkyl, and heterocycloalkyl, $R^5$ and $R^6$ are independently selected from hydrogen, a halogen group, a hydroxy group, —$NO_2$, —NR'R", —$N_2$, a C1-C8 alkyl group, a C1-C8 alkyl group substituted with a halogen group, and a C1-C8 alkyl group substituted with a hydroxy group, and R' and R" are independently selected from hydrogen and a C1-C4 alkyl group, or R' and R" may be connected to each other to form a 5- to 7-membered ring.

In a specific aspect of the present disclosure, in Formula 1, $R^1$ to $R^4$ are independently selected from hydrogen, a halogen group, a C1-C4 alkyl group, a C1-C4 alkyl group substituted with a halogen group, cycloalkyl, and heterocycloalkyl; $R^5$ and $R^6$ are independently selected from —$NO_2$, —$NH_2$, —NHR', —NR'R", —$N_2$, and a C1-C4 alkyl group; and R' and R" are the same or different C1-C4 alkyl groups, or R' and R" may be connected to each other to form a 5- to 7-membered ring.

As an example of the present disclosure, in Formula 1, $R^1$ to $R^4$ are a C1-C4 alkyl group, $R^5$ and $R^6$ are independently selected from —$NO_2$, —NHR', —NR'R", and a C1-C4 alkyl group, and at least one of $R^5$ and $R^6$ are selected from —$NO_2$, —NHR', and —NR'R"; and R' and R" may be a methyl group, or R' and R" may be connected to each other to form a 5-membered ring.

As an example of the present disclosure, in Formula 1, $R^1$ to $R^4$ are a methyl group, $R^5$ and $R^6$ are independently selected from —$NO_2$, —NHR', —NR'R", and a methyl group, and R' and R" are a methyl group or R' and R" may be connected to each other to form a 5-membered ring containing N.

In another specific aspect of the present disclosure, in Formula 1, $R^1$ to $R^4$ may be independently selected from a C1-C4 alkyl group, a C1-C4 alkyl group substituted with a halogen group, cycloalkyl, and heterocycloalkyl; $R^5$ and $R^6$ may be independently selected from hydrogen and a halogen group.

As an example of the present disclosure, in Formula 1, $R^1$ to $R^4$ are a C1-C4 alkyl group, and $R^5$ and $R^6$ may be the same or different halogen groups.

As an example of the present disclosure, in Formula 1, $R^1$ to $R^4$ may be a methyl group, and $R^5$ and $R^6$ may be chlorine.

The compound represented by Formula 1 according to the present disclosure may include the following specific compounds:

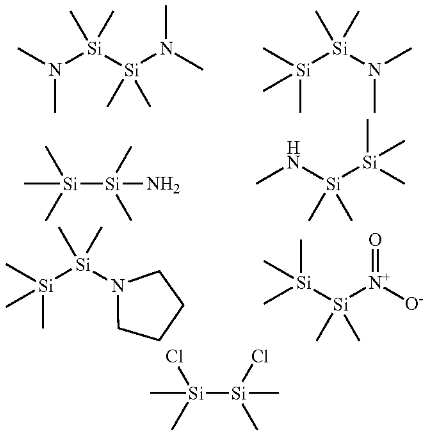

The organic solvent may be an aprotic solvent with a dielectric constant of 10 or less or 9 or less. Here, the lower limit of the dielectric constant may be, for example, 0.01 or more, 0.1 or more, or 1 or more, but is not particularly limited thereto. As a specific embodiment, the organic solvent may be an aprotic solvent with a dielectric constant of 0.01 to 10, 0.1 to 10, or 1 to 9. Among these, C5-C10 aliphatic alkane-based solvents or acetate-based solvents are preferred. Specifically, C5-C10 aliphatic alkane-based solvents may be pentane, hexane, heptane, octane, and the like, and acetate-based solvents may be specified by the following Formula 2:

[Formula 2]

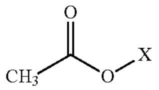

wherein X is a straight or branched chain C1-C6 alkyl group, and —$CH_2$— of the alkyl may be further substituted with an oxygen atom.

Non-limiting examples of the acetate-based solvent may include butyl acetate, propyl acetate, pentyl acetate, propylene glycol methyl ethyl acetate, ethylene glycol monobutyl ether acetate, propylene glycol monomethyl ether acetate, and propylene glycol monoethyl ether acetate.

The Si-based compound represented by Formula 1 may easily exhibit water repellency in a short time through the organic solvent.

The composition for cleaning a substrate for a semiconductor device according to a non-limiting embodiment of the present disclosure may contain a Si-based compound represented by Formula 1 and a C5-C10 aliphatic alkane-based solvent or acetate-based solvent with a dielectric constant of 9 or less, wherein in Formula 1, $R^1$ to $R^4$ are a C1-C4 alkyl group, $R^5$ and $R^6$ are independently selected from —$NO_2$, —NHR', —NR'R", and a C1-C4 alkyl group; at least one of $R^5$ and $R^6$ are selected from —$NO_2$, —NHR', and —NR'R"; and R' and R" are a methyl group, or R' and R" may be connected to each other to form a 5-membered ring.

The composition for cleaning a substrate for a semiconductor device according to a preferred embodiment of the present disclosure may contain following specific compounds among the compounds represented by Formula 1 and at least one organic solvent selected from the group consisting of propylene glycol monomethylether acetate, propylene glycol monoethyl ether acetate, butyl acetate, pentyl acetate, and hexane.

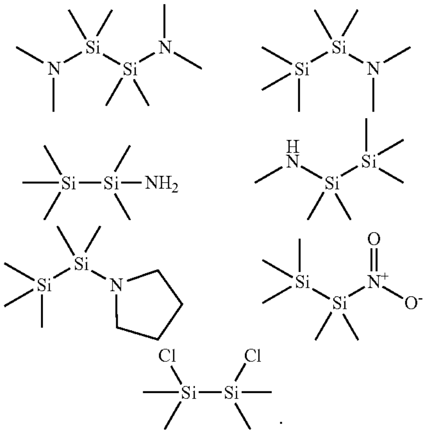

In this case, the compound represented by Formula 1 may chemically bond with Si elements of the silicon wafer to form a water-repellent protective film on a surface of the substrate. This allows a capillary force in the recesses of the pattern to become smaller during the drying process after the wet cleaning process, providing an effect that prevents the pattern from collapsing.

A composition according to an embodiment of the present disclosure may contain 0.1 to 15% by weight of the compound represented by Formula 1 and the balance organic solvent based on the total weight of the composition. Specifically, the composition may contain 1 to 10% by weight of the compound represented by Formula 1 and the balance organic solvent. More specifically, the composition may contain 1 to 5% by weight of the compound represented by Formula 1 and the balance organic solvent. The composition according to the present disclosure having the composition described above may sufficiently form a water-repellent protective film and efficiently prevent the collapse of the fine patterns of the semiconductor with a high aspect ratio during drying after the cleaning process.

The composition according to the present disclosure may further contain at least one of a reaction accelerator and a surfactant.

An acid catalyst or a basic catalyst may be added as the reaction accelerator.

The acid catalyst may promote a reaction between the composition according to the present disclosure and the substrate to quickly form a protective film that exhibits a water-repellent effect. The acid catalyst may be an organic acid, and a Lewis acid, and the organic acid may be specifically acetic acid, trifluoroacetic acid, pentafluoropropionic acid, methanesulfonic acid, benzenesulfonic acid, or trifluoromethanesulfonic acid. The Lewis acid may be an acid anhydride, a silicon compound, or a boron compound, and specifically, alkanesulfonic acid anhydride, acetic acid anhydride, trifluoroacetic acid anhydride, pentafluoropropionic acid anhydride, carboxylic acid anhydride, trifluoroboron, alkyl boric acid ester, tris(trifluoroacetoxy)boron, or trialkoxyboroxine.

The basic catalyst is preferably a nitrogen-containing compound, and may specifically be, for example, methylamine, ethylamine, propylamine, diethylamine, triethylamine, dipropylamine, tripropylamine, ethanolamine, or triethanolamine.

The use of non-ionic ethylene oxide or fluorine-based surfactants as surfactants is preferred in terms of reducing surface tension, and this case, the penetrability of the composition according to the present disclosure into a silicon-based substrate may be improved. The fluorine-based surfactant may be specifically selected from the group consisting of a perfluoroalkyl sulfonamide salt, perfluorooctane sulfonate, perfluorobutane sulfonate, perfluorononanoate, and perfluorooctanoate, but the present disclosure is not particularly limited thereto.

In addition, the composition according to an embodiment of the present disclosure may contain 0.1 to 15% by weight of the compound represented by Formula 1, 0.01 to 8% by weight of a surfactant, 0.01 to 15% by weight of a reaction accelerator, and the balance organic solvent based on the total weight of the composition.

Specifically, the composition according to an embodiment of the present disclosure may contain 1 to 10% by weight of the compound represented by Formula 1, 0.01 to 5% by weight of a surfactant, 0.1 to 10% by weight of a reaction accelerator, and the balance organic solvent.

More specifically, the composition according to an embodiment of the present disclosure may contain 2 to 6% by weight of the compound represented by Formula 1, 0.01 to 3% by weight of a surfactant, 0.1 to 2% by weight of a reaction accelerator, and the balance organic solvent.

When the composition satisfying the composition described above is used in a cleaning process for removing surface contaminants on a substrate for a semiconductor device, it is easy to remove contaminants on the surface as the surface tension of the substrate is reduced, and it is possible to effectively form a water-repellent protective film that may prevent the fine pattern of a semiconductor with a high aspect ratio from collapsing. This, in turn, can provide the advantage of manufacturing highly reliable semiconductor devices.

In a non-limiting embodiment of the present disclosure, a cleaning agent composition for a substrate for a semiconductor device may contain 1 to 10% by weight of the compound represented by Formula 1, 0.1 to 10% by weight of a basic catalyst, and the balance organic solvent.

More specifically, the cleaning agent composition for a substrate for a semiconductor device may contain 1 to 10% by weight of the compound represented by Formula 1, 0.1 to 5% by weight of a basic catalyst, and the balance organic solvent.

Alternatively, the cleaning agent composition for a substrate for a semiconductor device may contain 1 to 10% by weight of the compound represented by Formula 1, 0.1 to 10% by weight of an acid catalyst, and the balance organic solvent.

More specifically, the cleaning agent composition for a substrate for a semiconductor device may contain 1 to 10% by weight of the compound represented by Formula 1, 0.1 to 2% by weight of an acid catalyst, and the balance organic solvent.

When the composition and content described above are satisfied, it is desirable because the generation of residues derived from a surface treatment agent added to form the water-repellent protective film is suppressed and stress in the pattern is not caused, thereby preventing defects in the semiconductor pattern, such as collapse of the pattern.

By increasing a contact angle with the substrate when treating a silicon-based substrate, the composition according to the present disclosure may exhibit a very excellent effect of preventing collapse of fine patterns even after a wet cleaning process due to a low surface tension. In particular, as the density of integrated circuits increases, it is possible to achieve excellent effects in fine patterns with high aspect ratios, which are applicable to the manufacture of various semiconductor devices.

In addition, the present disclosure may provide a method for cleaning a substrate for a semiconductor device using the cleaning agent composition for a substrate for a semiconductor device as described above.

Specifically, the method may include a cleaning step of bringing the cleaning agent composition for a substrate for a semiconductor device as described above into contact with a surface of a substrate with a residue after etching That is, the method includes bringing a substrate for a semiconductor device on which a photoresist pattern is formed into contact with the cleaning agent composition wherein since the semiconductor substrate may be a result of etching the layer to be etched using the photoresist pattern as an etching mask, the cleaning agent composition may be used to clean a photoresist polymer residue. As a standard for evaluating cleaning power, the time to remove the photoresist polymer residue may be 90 seconds or less, or 60 seconds or less.

The cleaning step may be carried out using either single type or batch type equipment.

In the method for cleaning a substrate for a semiconductor device according to an embodiment of the present disclosure, the cleaning step may vary depending on the type and condition of the photoresist to be removed, but is preferably performed in a range of 25 to 70° C. Specifically, it may be carried out at 25 to 60° C. and 30 to 50° C.

According to the present disclosure, excellent cleaning power may be achieved even under mild temperature conditions. Additionally, the cleaning step may be carried out by immersion for about 10 to 60 seconds under temperature conditions as described above.

The substrate is a substrate used to manufacture a semiconductor device, specifically a silicon-based substrate containing Si, $SiO_2$, SiON, SiN, p-Si, α-Si, W—Si, Al—Si, or Si—C, and specifically, a single film containing a silicon element such as silicon (Si), silicon oxide ($SiO_x$), or silicon nitride (SiN) formed on the wafer surface. Alternatively, the substrate may contain two or more selected from silicon, silicon oxide, or silicon nitride.

A preferred example of the present disclosure may be a single film composed of silicon (Si), silicon oxide ($SiO_x$), or silicon nitride (SiN). SiN has a low reactivity with Si-based additives compared to other silicon-based substrates, making it difficult to obtain a high contact angle. However, the composition according to the present disclosure may obtain sufficient water repellency to prevent pattern collapse by increasing the contact angle with the SiN substrate. Specifically, when the composition according to the present disclosure is treated for 60 s, the contact angle to the SiN substrate may be 50° or more, 60° or more, or 70° or more. Here, the upper limit of the contact angle with the SiN substrate may be, for example, 100° or less, but the present disclosure is not particularly limited thereto. As a specific embodiment, the contact angle with the SiN substrate may be 50 to 100°, 60 to 100°, or 70 to 100°.

The contact angle with the $SiO_x$ substrate may be 60° or more, 70° or more, or 80° or more. The contact angle with the Si substrate may be 70° or more, or 80° or more. Here, the upper limit of the contact angle with the $SiO_x$ substrate and the Si substrate may be independently of each other 100° or less, or 120° or less, but the present disclosure is not particularly limited thereto. As a specific embodiment, the contact angle with the $SiO_x$ substrate may be 60 to 100°, 70 to 100°, or 80 to 100°. The contact angle with the Si substrate may be 70 to 100°, or 80 to 100°.

In addition, the present disclosure may provide a method for manufacturing a semiconductor device including the cleaning step of a substrate for a semiconductor device, as described above.

In addition, the present disclosure may provide a method for preparing a cleaning agent composition for a substrate for a semiconductor device including: mixing the compound represented by Formula 1 according to an embodiment and an organic solvent according to an embodiment with each other.

Hereinafter, the present disclosure will be described in more detail on the basis of Examples and Comparative Examples. However, the following Examples and Comparative Examples are only examples for describing the present disclosure in more detail, and the present disclosure is not limited by the following Examples and Comparative Examples. All temperatures refer to the unit of ° C. unless otherwise noted in the disclosure, and the amount of composition used refers to the unit of wt % unless otherwise specified.

Examples 1 to 12 and Comparative Examples 1 to 6

After mixing the composition in a composition ratio shown in Table 1 below, the mixture was stirred at a speed of 500 rpm for 5 minutes at 25° C. to prepare a cleaning agent composition.

TABLE 1

| | Si compound | | Organic solvent | | Additive | |
|---|---|---|---|---|---|---|
| Composition | Type | Content | Type | Content | Type | Content |
| Example 1 | BDATS | 3% | PGMEA | 97% | — | |
| Example 2 | DAPS | 5% | PGMEA | 95% | — | |
| Example 3 | APS | 3% | nBA | 97% | — | |
| Example 4 | PMDP | 5% | Hexane | 95% | — | |
| Example 5 | NAPS | 3% | nBA | 97% | — | |
| Example 6 | DCTS | 5% | PGMEA | 94.9% | Acetic acid | 0.1% |
| Example 7 | PMDP | 5% | PGMEA | 94.9% | Trifluoroacetic acid | 0.1% |
| Example 8 | APS | 3% | PGMEA | 96% | Triethylamine | 1% |
| Example 9 | BDATS | 3% | PGMEA | 95% | Triethylamine | 2% |
| Example 10 | BDATS | 10% | PGMEA | 90% | — | |
| Example 11 | BDATS | 1% | PGMEA | 98.9% | Fluorine-based surfactant (FS-3100) | 0.1% |
| Example 12 | NPMD | 3% | nBA | 97% | — | |

TABLE 1-continued

| | Si compound | | Organic solvent | | Additive | |
|---|---|---|---|---|---|---|
| Composition | Type | Content | Type | Content | Type | Content |
| Comp. Example 1 | HMDS | 5% | PGMEA | 95% | — | |
| Comp. Example 2 | BDATS | 3% | IPA | 97% | — | |
| Comp. Example 3 | BDATS | 3% | Methanol | 97% | — | |
| Comp. Example 4 | BDATS | 3% | EC | 97% | — | |
| Comp. Example 5 | DMATMS | 3% | EC | 97% | — | |
| Comp. Example 6 | DMATMS | 5% | PGMEA | 95% | — | |

BDTAS: 1,2-bis(dimethylamino)tetramethyldisilane
DAPS: N,N-dimethylaminopentamethyldisilane
APS: aminopentamethyldisilane
NAPS: N-methylaminopentamethyldisilane
PMDP: 1-(pentamethyldisilanyl)pyrrolidine
NPMD: nitropentamethyldisilane
DCTS: dichlorotetramethyldisilane
HMDS: hexamethyldisilazane
DMATMS: N,N-dimethylaminotrimethylsilane
EC: ethyl carbonate
PGMEA: Propylene Glycol Monomethyl Ether Acetate
nBA: n-Butyl acetate

Experimental Example 1. Evaluation of Contact Angle With Single-Layer Substrate $SiO_x$, SiN, and Si single-layer substrates, which are the film materials used to implement fine patterns, were prepared, treated with an aqueous HF solution at 25° C. for 60 seconds, and then treated with isopropanol (IPA) at 25° C. for 1 minute. Afterwards, each substrate was treated with the composition according to Examples 1 to 12 and Comparative Examples 1 to 6 for 60 seconds, and then the contact angle with the substrates were measured.

The results are shown in Table 2 below. In general, SiN has a low reactivity with Si additives compared to other $SiO_x$ and Si substrates, making it difficult to obtain a high contact angle. However, the contact angle with the SiN substrate was particularly high when treated with the exemplary composition of the present disclosure. The exemplary compositions of the present disclosure showed a high contact angle of at least 50° when treated for the 60 seconds, and therefore, it could be confirmed that the exemplary composition of the present disclosure was able to achieve sufficient water repellency to prevent pattern collapse.

Experimental Example 2. Evaluation of Pattern Collapse After Treating Fine Patterned Substrate With Cleaning Agent Composition After a substrate on which the fine patterns using SiN were formed with the composition according to Examples 1 to 12 and Comparative Examples 1 to 6, the presence of pattern collapse was confirmed by SEM images. The results are shown in FIGS. 1 and 2.

Figure 2:
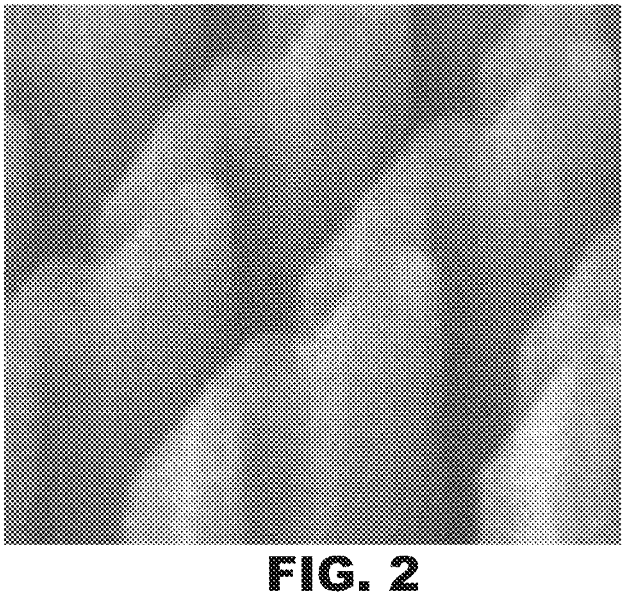
FIG. 2 illustrates an SEM image with a high aspect ratio pattern after cleaning a substrate according to a comparative example of the present disclosure.

Referring to FIG. 1, it can be seen that a fine patterned structure with a high aspect ratio was successfully maintained when the example materials are processed. This is because the SiN surface is coated with the Si compound according to the present disclosure to increase the water repellency of the pattern surface and reduce the surface tension, so that the pattern does not collapse even during drying after DIW cleaning. On the other hand, referring to FIG. 2, it could be observed that the patterns collapsed and stuck together to form a bridge when the comparative example materials were treated.

Experimental Example 3. Residual Evaluation

The substrate was treated with the cleaning agent composition according to Experimental Example 1 and then treated with IPA for 60 seconds. Afterwards, the substrate was washed with pure water (DIW) and dried using $N_2$ gas. The substrate was baked at 500° C. for 1 to 2 hours using a hot plate, and then the contact angle was measured to verify whether there was any residue. As shown in Table 2 below, it could be confirmed that the material coated on the surface was finally removed from the result that the contact angle was reduced back to 30°.

TABLE 2

| | Contact angle | | | Collapse prevention | Residual evaluation (Contact |
|---|---|---|---|---|---|
| Composition | SiOx | SiN | Si | force | angle) |
| Example 1 | 86 | 81 | 88 | ○ | 28 |
| Example 2 | 82 | 75 | 84 | ○ | 27 |
| Example 3 | 83 | 65 | 81 | ○ | 26 |
| Example 4 | 77 | 51 | 78 | ○ | 28 |
| Example 5 | 78 | 68 | 76 | ○ | 27 |
| Example 6 | 72 | 48 | 73 | ○ | 26 |
| Example 7 | 71 | 49 | 74 | ○ | 27 |
| Example 8 | 85 | 81 | 82 | ○ | 31 |
| Example 9 | 93 | 88 | 94 | ○ | 27 |
| Example 10 | 87 | 84 | 89 | ○ | 26 |
| Example 11 | 83 | 77 | 85 | ○ | 30 |
| Example 12 | 76 | 52 | 78 | ○ | 27 |
| Comp. Example 1 | 55 | 32 | 57 | X | 29 |
| Comp. Example 2 | 21 | 28 | 31 | X | 31 |

TABLE 2-continued

| Composition | Contact angle | | | Collapse prevention force | Residual evaluation (Contact angle) |
|---|---|---|---|---|---|
| | SiOx | SiN | Si | | |
| Comp. Example 3 | 24 | 31 | 27 | X | 28 |
| Comp. Example 4 | 28 | 27 | 25 | X | 30 |
| Comp. Example 5 | 25 | 21 | 30 | X | 29 |
| Comp. Example 6 | 62 | 40 | 63 | X | 27 |

The cleaning agent composition for a substrate for a semiconductor device according to the present disclosure reduces a surface energy of a patterned substrate when applied to a pattern with a large aspect ratio, thereby preventing collapse of the pattern during subsequent wet cleaning and drying, and enabling fine patterns to be implemented without supercritical cleaning.

In addition, among Si-based compounds most commonly used in implementing fine patterns, SiN tends to have a lower contact angle compared to other Si-based films when conventional additives are used. However, the cleansing agent composition according to the present disclosure may be adsorbed on the SiN surface in a short time, making it easy to form a water-repellent protective film, and significantly increasing a contact angle with SiN, thereby reducing capillary force and significantly improving pattern collapse.

Hereinabove, although the present disclosure has been described by specific matters, the limited Examples, and Comparative examples, they have been provided only for assisting in a more general understanding of the present disclosure. Therefore, the present disclosure is not limited to the exemplary embodiments. Various modifications and changes may be made by those skilled in the art to which the present disclosure pertains from this description.

Therefore, the spirit of the present disclosure should not be limited to the above-mentioned embodiments, but the claims and all of the modifications equal or equivalent to the claims are intended to fall within the scope and spirit of the present disclosure.

What is claimed is:

1. A cleaning agent composition for a substrate for a semiconductor device, comprising a compound represented by the following Formula 1 and an organic solvent, wherein the organic solvent is an aprotic organic solvent with a dielectric constant of 9 or less, wherein the organic solvent is an acetate-based solvent represented by the following Formula 2 or a C5-C10 aliphatic alkane-based solvent:

[Formula 1]

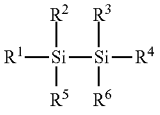

wherein $R^1$ to $R^4$ are independently selected from the group consisting of hydrogen, a halogen group, a hydroxy group, a C1-C8 alkyl group, a C1-C8 alkyl group substituted with a halogen group, a C1-C8 alkyl group substituted with a hydroxy group, cycloalkyl, and heterocycloalkyl;

$R^5$ and $R^6$ are independently selected from the group consisting of hydrogen, a halogen group, a hydroxy group, —$NO_2$, —NR'R", —$N_2$, a C1-C8 alkyl group, a C1-C8 alkyl group substituted with a halogen group, and a C1-C8 alkyl group substituted with a hydroxy group; and R' and R" are independently selected from the group consisting of hydrogen and a C1-C4 alkyl group, or R' and R" may be connected to each other to form a 5- to 7-membered ring,

[Formula 2]

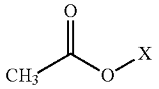

wherein X is a straight or branched chain C1-C6 alkyl group, and —$CH_2$— of the alkyl may be substituted with an oxygen atom.

2. The cleaning agent composition for a substrate for a semiconductor device of claim 1, wherein in Formula 1, $R^1$ to $R^4$ are independently selected from the group consisting of hydrogen, a halogen group, a C1-C4 alkyl group, a C1-C4 alkyl group substituted with a halogen group, cycloalkyl, and heterocycloalkyl;

$R^5$ and $R^6$ are independently selected from the group consisting of —$NO_2$, —$NH_2$, —NHR', —NR'R", —$N_2$, and a C1-C4 alkyl group; and R' and R" are the same or different C1-C4 alkyl groups, or R' and R" may be connected to each other to form a 5- to 7-membered ring.

3. The cleaning agent composition for a substrate for a semiconductor device of claim 1, wherein in Formula 1, $R^1$ to $R^4$ are independently selected from the group consisting of a C1-C4 alkyl group, a C1-C4 alkyl group substituted with a halogen group, cycloalkyl, and heterocycloalkyl; and $R^5$ and $R^6$ are independently selected from the group consisting of hydrogen and a halogen group.

4. The cleaning agent composition for a substrate for a semiconductor device of claim 2, wherein in Formula 1, $R^1$ to $R^4$ are a C1-C4 alkyl group, $R^5$ and $R^6$ are independently selected from the group consisting of —$NO_2$, —NHR', —NR'R", and a C1-C4 alkyl group, and at least one of $R^5$ and $R^6$ are selected from the group consisting of —$NO_2$, —NHR', and —NR'R", and R' and R" are a methyl group, or R' and R" may be connected to each other to form a 5-membered ring.

5. The cleaning agent composition for a substrate for a semiconductor device of claim 3, wherein in Formula 1, $R^1$ to $R^4$ are a C1-C4 alkyl group; and $R^5$ and $R^6$ are the same or different halogen groups.

6. The cleaning agent composition for a substrate for a semiconductor device of claim 1, wherein the compound represented by Formula 1 is selected from the group consisting of the structures below:

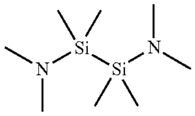

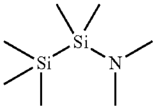

-continued

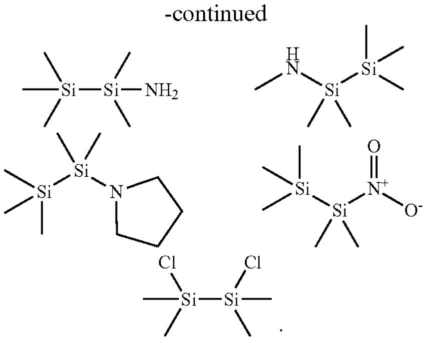

7. The cleaning agent composition for a substrate for a semiconductor device of claim 1, wherein the composition comprises 1 to 10% by weight of the compound represented by Formula 1 and the balance organic solvent based on the total weight of the composition.

8. The cleaning agent composition for a substrate for a semiconductor device of claim 1, further comprising at least one of a reaction accelerator and a surfactant.

9. The cleaning agent composition for a substrate for a semiconductor device of claim 8, wherein the composition comprises 1 to 10% by weight of the compound represented by Formula 1, 0.1 to 10% by weight of a reaction accelerator, and the balance organic solvent based on the total weight of the composition.

10. The cleaning agent composition for a substrate for a semiconductor device of claim 9, wherein the reaction accelerator is an acid catalyst selected from the group consisting of acetic acid, trifluoroacetic acid, and trifluoroboron, or a basic catalyst selected from the group consisting of methylamine, ethylamine, propylamine, diethylamine, triethylamine, dipropylamine, tripropylamine, ethanolamine, and triethanolamine.

11. A method for cleaning a substrate for a semiconductor device comprising: a cleaning step of bringing the cleaning agent composition for a substrate for a semiconductor device of claim 1 into contact with a surface of a substrate with a residue after etching.

12. A method for cleaning a substrate for a semiconductor device of claim 11, wherein a contact angle measured after the composition is brought into contact with a silicon nitride film for 60 seconds is 60° or more.

13. A method for manufacturing a semiconductor device comprising the cleaning step of a substrate for a semiconductor device of claim 11.

14. A method for preparing a cleaning agent composition for a substrate for a semiconductor device comprising: mixing a compound represented by Formula 1 and an aprotic organic solvent with a dielectric constant of 9 or less with each other, wherein the organic solvent is an acetate-based solvent represented by the following Formula 2 or a C5-C10 aliphatic alkane-based solvent:

[Formula 1]

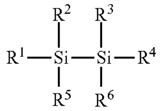

wherein $R^1$ to $R^4$ are independently selected from the group consisting of hydrogen, a halogen group, a hydroxy group, a C1-C8 alkyl group, a C1-C8 alkyl group substituted with a halogen group, a C1-C8 alkyl group substituted with a hydroxy group, cycloalkyl, and heterocycloalkyl;

$R^5$ and $R^6$ are independently selected from the group consisting of hydrogen, a halogen group, a hydroxy group, —$NO_2$, —NR'R", —$N_2$, a C1-C8 alkyl group, a C1-C8 alkyl group substituted with a halogen group, and a C1-C8 alkyl group substituted with a hydroxy group; and R' and R" are independently selected from the group consisting of hydrogen and a C1-C4 alkyl group, or R' and R" may be connected to each other to form a 5- to 7-membered ring,

[Formula 2]

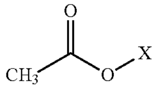

wherein X is a straight or branched chain C1-C6 alkyl group, and —$CH_2$— of the alkyl may be substituted with an oxygen atom.

* * * * *